(12) United States Patent
Koike et al.

(10) Patent No.: US 11,545,473 B2
(45) Date of Patent: Jan. 3, 2023

(54) LIGHT-EMITTING DEVICE

(71) Applicant: STANLEY ELECTRIC CO., LTD., Tokyo (JP)

(72) Inventors: Kyotaro Koike, Tokyo (JP); Ji-Hao Liang, Tokyo (JP); Mitsunori Harada, Tokyo (JP); Shunya Ide, Tokyo (JP); Hiroshi Kotani, Tokyo (JP); Soji Owada, Tokyo (JP); Satoshi Ando, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 20 days.

(21) Appl. No.: 17/207,481

(22) Filed: Mar. 19, 2021

(65) Prior Publication Data

US 2021/0305216 A1      Sep. 30, 2021

(30) Foreign Application Priority Data

Mar. 24, 2020  (JP) .............................. JP2020-052946

(51) Int. Cl.
  *H01L 25/075*       (2006.01)
  *H01L 33/54*         (2010.01)
        (Continued)

(52) U.S. Cl.
  CPC ........ *H01L 25/0753* (2013.01); *H01L 33/505* (2013.01); *H01L 33/54* (2013.01); *H01L 33/60* (2013.01)

(58) Field of Classification Search
  CPC ... H01L 25/0753; H01L 33/505; H01L 33/54; H01L 33/60
  See application file for complete search history.

(56) References Cited

U.S. PATENT DOCUMENTS

| | | | |
|---|---|---|---|
| 2012/0025218 A1* | 2/2012 | Ito ......................... | H01L 33/505 257/E33.061 |
| 2014/0027804 A1* | 1/2014 | Yoneda ................... | H01L 24/18 438/69 |
| 2022/0209079 A1* | 6/2022 | Yamaoka ............ | H01L 25/0753 |

FOREIGN PATENT DOCUMENTS

| | | | |
|---|---|---|---|
| CN | 102299245 A | * 12/2011 | ........... H01L 33/505 |
| CN | 107689413 A | *  2/2018 | ............. F21S 43/14 |

(Continued)

*Primary Examiner* — Mary Ellen Bowman
(74) *Attorney, Agent, or Firm* — Holtz, Holtz & Volek PC

(57) ABSTRACT

A light-emitting device according to the present invention comprises: a mounting board; a plurality of light-emitting elements that each include a supporting substrate and a semiconductor structure layer, the supporting substrate being disposed on the mounting board, and the semiconductor structure layer being formed on the supporting substrate and including a light-emitting layer; a wavelength conversion member that covers the plurality of light-emitting elements above the light-emitting elements and converts a wavelength of a light emitted from the light-emitting layer; a translucent member that covers a lower surface of the wavelength conversion member and covers the semiconductor structure layer on the supporting substrate; and a resin member filled between the plurality of light-emitting elements, the resin member being formed of a resin material containing particles having a light reflectivity. The translucent member includes a thin film portion having a constant film thickness between the wavelength conversion member and the resin member in a region between the plurality of light-emitting elements, and the constant film thickness is smaller than a distance between a top surface of the supporting substrate and a lower surface of the wavelength conversion member.

7 Claims, 6 Drawing Sheets

(51) Int. Cl.
*H01L 33/60* (2010.01)
*H01L 33/50* (2010.01)

(56) References Cited

FOREIGN PATENT DOCUMENTS

| CN | 107887488 A | * | 4/2018 | ............ F21V 17/101 |
| JP | 2010219324 A | * | 9/2010 | |
| JP | 2010219324 A | | 9/2010 | |

* cited by examiner

LIGHT-EMITTING DEVICE

BACKGROUND

1. Technical Field

The present invention relates to a light-emitting device that includes a light-emitting element, such as a light-emitting diode.

2. Description of the Related Art

Conventionally, there has been known a light-emitting device that includes a light-emitting element and a wavelength conversion body in combination. The light-emitting element emits a light having a predetermined wavelength, that is, a light of a predetermined color. The wavelength conversion body converts a wavelength of a light from a light source (for example, Japanese Patent Application Laid-Open No. 2010-219324).

In the light-emitting device using the light-emitting element, it is desired that a light emitted from the light-emitting element is emitted from the light-emitting device at a high rate, that is, a high light extraction efficiency is desired. In the light-emitting device, it is desired that an optical intensity is less depressed in a light emitting surface from which the light is emitted, and an optical output is uniform in the light emitting surface. When a plurality of light-emitting elements are placed side by side to form one light-emitting device, it is considered as one of the problems that depression of the optical intensity occurs in a region between the light-emitting elements.

The present invention is made in consideration of the above-described points, and its object is to provide a light-emitting device that ensures a high light extraction efficiency and has a high uniformity of an optical intensity in a light extraction surface.

SUMMARY

A light-emitting device according to the present invention comprises: a mounting board; a plurality of light-emitting elements that each include a supporting substrate and a semiconductor structure layer, the supporting substrate being disposed on the mounting board, and the semiconductor structure layer being formed on the supporting substrate and including a light-emitting layer; a wavelength conversion member that covers the plurality of light-emitting elements above the light-emitting elements and converts a wavelength of a light emitted from the light-emitting layer; a translucent member that covers a lower surface of the wavelength conversion member and covers the semiconductor structure layer on the supporting substrate; and a resin member filled between the plurality of light-emitting elements, the resin member being formed of a resin material containing particles having a light reflectivity. The translucent member includes a thin film portion having a constant film thickness between the wavelength conversion member and the resin member in a region between the plurality of light-emitting elements, and the constant film thickness is smaller than a distance between a top surface of the supporting substrate and a lower surface of the wavelength conversion member.

DETAILED DESCRIPTION

Figure 1:
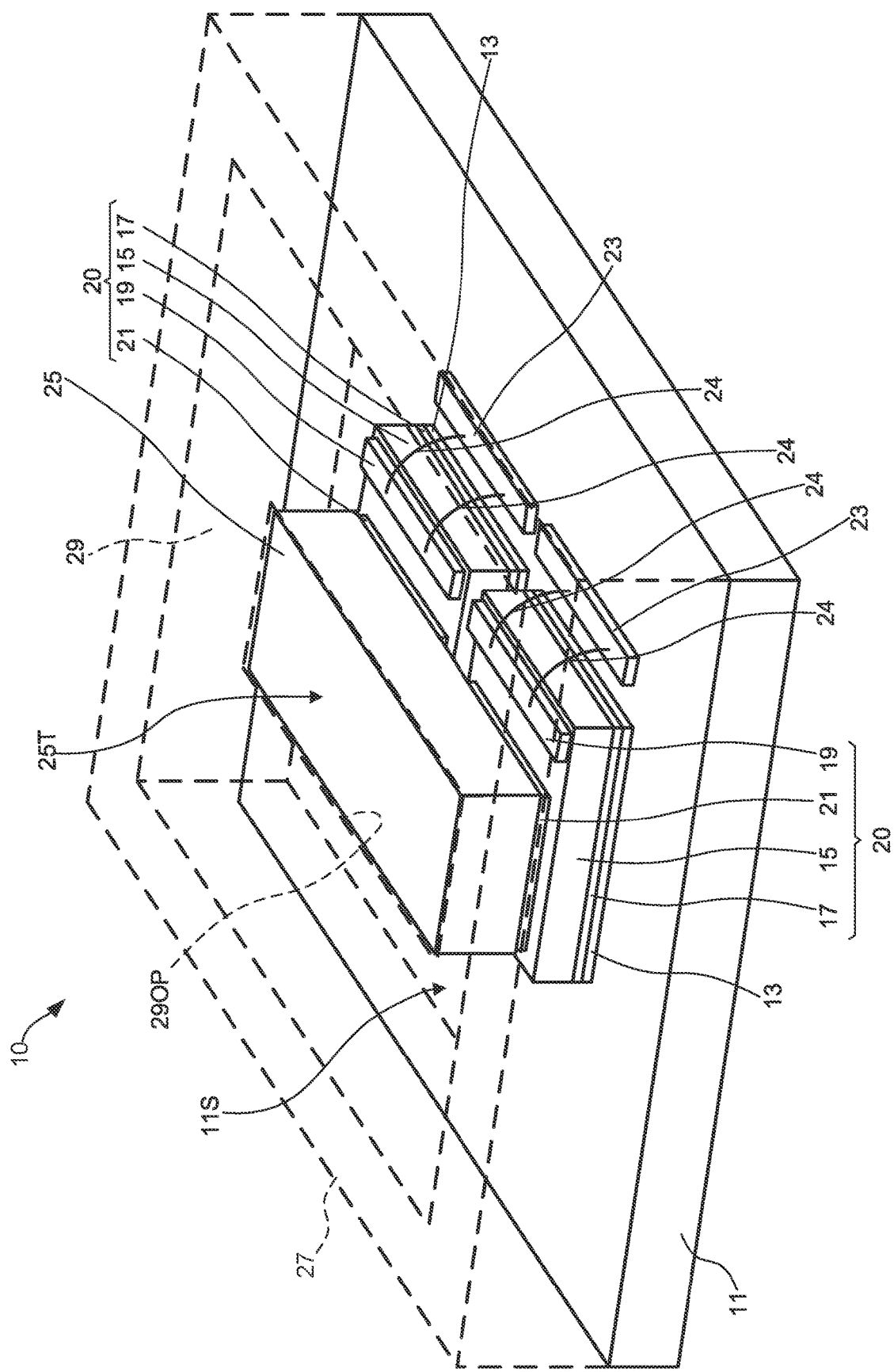
FIG. 1 is a perspective view illustrating a configuration of a light-emitting device according to Embodiment 1.

The following describes embodiments of the present invention in detail. In the following description and attached drawings, the same reference numerals designate substantially the same or equivalent parts.

Embodiment 1

FIG. 1 is a perspective view illustrating a configuration of a semiconductor light-emitting device (hereinafter also referred to as simply a light-emitting device) 10 according to Embodiment 1 of the present invention. As illustrated in FIG. 1, the semiconductor light-emitting device 10 includes two light-emitting elements 20 mounted on a mounting board 11.

The mounting board 11 is a board that includes a mounting surface 11S and has a planar shape of rectangular flat plate shape viewed in a direction perpendicular to the mounting surface 11S. For the mounting board 11, an insulative substrate of AlN, alumina, or the like is used. In this embodiment, the mounting board 11 has a thickness of, for example, about 500 μm.

An n-side power feeding pad 13 is a metal wiring electrode pattern having a rectangular planar shape formed on the mounting surface 11S. The two n-side power feeding pads 13 are disposed side by side in a direction along one side of the mounting surface 11S on the mounting surface 11S, and mutually separated. That is, the two n-side power feeding pads 13 are arranged in the direction along the one side of the mounting surface 11S. In this embodiment, the n-side power feeding pads 13 are each oriented in a manner in which the sides of the n-side power feeding pad 13 are parallel to the respective sides of the mounting surface 11S. For example, the n-side power feeding pad 13 is configured to be connected to an external power source via a through-hole (not illustrated) penetrating the mounting board 11 via a lower surface of the mounting board 11.

The two light-emitting elements 20 are disposed on the mounting surface 11S of the mounting board 11. The two light-emitting elements 20 are disposed on the respective n-side power feeding pads 13. The light-emitting element includes a supporting substrate 15 and a semiconductor structure layer that is formed on the supporting substrate 15 and includes a light-emitting layer.

The supporting substrate 15 of each light-emitting element 20 is a substrate having a planar shape of a rectangular flat plate shape. The supporting substrate 15 is a conductive substrate such as a Si substrate. For example, the planar shape of the supporting substrate 15 is approximately the same as the planar shape of the n-side power feeding pad 13. In this embodiment, the supporting substrate 15 has a thickness of, for example, about 120 μm. The supporting substrates 15 each include a back surface electrode 17 on a lower surface opposing the mounting surface 11S, and the back surface electrode 17 is a metal film formed to cover the lower surface. The back surface electrode 17 is bonded to the n-side power feeding pad 13 via a conductive bonding material (not illustrated), thereby bonding the supporting substrate 15 and the mounting board 11.

A power feeding electrode 19 is a metal electrode disposed on a surface on the opposite side of the surface on which the back surface electrode 17 is formed, that is, a top surface of each supporting substrate 15. The power feeding electrode 19 extends in the arranging direction of the n-side power feeding pads 13, that is, along the one side along the arranging direction of the light-emitting elements 20 on the top surface of the supporting substrate 15. Specifically, for example, the power feeding electrode 19 has a rectangular planar shape extending along the arranging direction of the n-side power feeding pads 13. For example, the power feeding electrodes 19 are each insulated from the supporting substrate 15 by an insulating layer (not illustrated) formed on the top surface of the supporting substrate 15.

A semiconductor stacked body 21 as the semiconductor structure layer is a stacked structure that includes a plurality of semiconductor layers, and the plurality of semiconductor layers include active layers emitting a blue light. The semiconductor stacked body 21 is disposed on each top surface of the supporting substrates 15. In this embodiment, the semiconductor stacked body 21 has a thickness of about 5 μm. The semiconductor stacked body 21 is formed to be separated from the power feeding electrode 19 on the supporting substrate 15. For example, the semiconductor stacked body 21 has a rectangular planar shape, and is disposed in a manner in which the sides of the rectangular shape are parallel to the respective sides of the top surface of the supporting substrate 15.

The semiconductor stacked body 21 is bonded to the supporting substrate 15 via a metal bonding layer (not illustrated). For example, the metal bonding layer includes two layers that are mutually separated and electrically insulated on the top surface of the supporting substrate 15. One of the two layers is electrically connected to the supporting substrate 15. The other is electrically connected to the power feeding electrode 19, and is electrically insulated from the supporting substrate 15 by, for example, an insulating layer formed on the top surface of the supporting substrate 15.

More specifically, the semiconductor stacked body 21 includes a p-type semiconductor layer, an active layer, and an n-type semiconductor layer stacked in this order from the supporting substrate 15 side. A wavelength of an emission light emitted from the active layer is a wavelength corresponding to a material and a composition of the semiconductor stacked body 21. The top surface of the semiconductor stacked body 21 serves as a light emitting surface.

For example, the p-type semiconductor layer is a Mg doped GaN layer. The active layer (light-emitting layer) is, for example, a semiconductor layer having a multiple quantum well structure that includes an InGaN well layer and a GaN barrier layer. The n-type semiconductor layer is, for example, a Si doped GaN layer. For example, a blue light having the wavelength of about 450 nm is emitted from the active layer.

The p-type semiconductor layer of the semiconductor stacked body 21 is electrically connected to only the bonding layer insulated from the supporting substrate 15 among the above-described bonding layers via a P-type element side electrode, and electrically connected to the power feeding electrode 19. The n-type semiconductor layer of the semiconductor stacked body 21 is, for example, electrically connected to only the bonding layer electrically connected to the supporting substrate 15 via an N-type element side electrode formed to penetrate the active layer and the p-type semiconductor layer. That is, the semiconductor stacked body 21 is supplied with an electric power via the back surface of the supporting substrate 15 and the power feeding electrode 19.

Hereinafter, the light-emitting element 20 includes the supporting substrate 15, the back surface electrode 17, the power feeding electrode 19, and the semiconductor stacked body 21 described above. For example, the semiconductor stacked body 21 may be formed by bonding a plurality of semiconductor layers including an active layer grown on a growth substrate (not illustrated) to the supporting substrate 15 via the bonding layer and removing the growth substrate by laser lift-off or the like. That is, the light-emitting element 20 may be an element of a top surface emission type having a bonded structure of what is called a thin-film type. The top surface of the semiconductor stacked body 21 serves as the light emitting surface of the light-emitting element 20.

A p-side power feeding pad 23 is a metal wiring electrode pattern having a rectangular planar shape formed on the mounting surface 11S. The two p-side power feeding pads 23 are formed along the respective power feeding electrodes 19 on the mounting surface 11S of the mounting board 11. That is, the two p-side power feeding pads 23 are disposed side by side in the direction the same as the arranging direction of the n-side power feeding pads 13 and mutually separated on the mounting surface 11S. For example, the p-side power feeding pad 23 is configured to be connected to an external power source via a through-hole (not illustrated) penetrating the mounting board 11.

The p-side power feeding pads 23 are connected to the respective power feeding electrodes 19 via bonding wires 24. That is, the light-emitting device 10 is configured in a manner in which the semiconductor stacked body 21 is supplied with the electric power from outside the light-emitting device 10 via the n-side power feeding pad 13 and the p-side power feeding pad 23.

A wavelength conversion member 25 is a member having a rectangular parallelepiped shape extending over the two light-emitting elements 20 along the arranging direction of the two light-emitting elements 20. That is, the wavelength conversion member 25 covers the two light-emitting elements 20 above the two light-emitting elements 20. For example, the wavelength conversion member 25 is a ceramic plate formed by sintering a material including a fluorescent material. In this embodiment, for example, phosphor particles are uniformly contained in the wavelength conversion member 25.

The wavelength conversion member 25 is bonded to the top surface of the semiconductor stacked body 21 on the light-emitting element 20 by a translucent adhesive material (not illustrated). The wavelength conversion member 25 has a top surface 25T that serves as a light extraction surface of the semiconductor light-emitting device 10. Hereinafter, the top surface 25T is also referred to as a light extraction surface 25T.

In this embodiment, for example, the wavelength conversion member 25 is a ceramic plate fabricated by sintering alumina and YAG (yttrium-aluminum-garnet, $Y_3Al_5O_{12}$) phosphor at a high temperature. For example, the ceramic plate used in this embodiment has a refractive index $n1=1.8$. The wavelength conversion member 25 may be a resin layer containing phosphor particles, such as a YAG:Ce phosphor, or may be, for example, a transparent body containing light converting nanoparticles or wavelength conversion nanoparticles.

For example, the phosphor particles as described above are excited by a blue light and emit a yellow fluorescent light. For example, when the blue light emitted from the light emitting surface of the light-emitting element 20 is introduced to the wavelength conversion member 25 containing the phosphor particles, a white light is extracted from the light extraction surface 25T of the semiconductor light-emitting device 10 by mixing the blue light and the fluorescent light from the phosphor particles.

A peripheral wall body 27 is a frame body disposed on the mounting surface 11S of the mounting board 11. To make the shape of the light-emitting element 20 clear, in FIG. 1, the part of the light-emitting element 20 supposed to be hidden by the peripheral wall body 27 is indicated by solid lines, and the contour of the peripheral wall body 27 is indicated by dashed lines.

The peripheral wall body 27 is formed along a peripheral edge of the mounting surface 11S of the mounting board 11, and surrounds the two light-emitting elements 20 and the wavelength conversion member 25 on the mounting surface 11S. For example, the peripheral wall body 27 is formed by processing the substrate of AlN, alumina, or the like into a frame shape by such as cutting work or by molding AlN or alumina in a frame shape. In this embodiment, a height of the peripheral wall body 27 from the mounting surface 11S is set to the same as a height from the mounting surface 11S to the light extraction surface 25T.

A covering body 29 as a resin member or a reflecting member is filled inside the peripheral wall body 27 on the mounting surface 11S. In other words, the covering body 29 is disposed in a region outside the light-emitting element 20 and the wavelength conversion member 25 and a region surrounded by the peripheral wall body 27 on the mounting board 11. To make the shape of the light-emitting element 20 clear, in FIG. 1, the part of the light-emitting element 20 supposed to be hidden by the covering body 29 is indicated by solid lines, and the contour of the covering body 29 is indicated by dashed lines. The covering body 29 is formed to cover the side surfaces of the light-emitting element 20 and the wavelength conversion member 25. The covering body 29 is formed to be provided with an opening portion 29OP from which the light extraction surface 25T is exposed.

The covering body 29 is formed of a material in which oxide particles (hereinafter also referred to as covering body particles), such as titanium oxide, zinc oxide, or alumina, having a light reflectivity are dispersed in a thermosetting resin, such as a silicone resin or an epoxy resin.

For example, the covering body 29 can be formed by filling the thermosetting resin containing the particles having the light reflectivity in the peripheral wall body 27 by an amount that the thermosetting resin does not reach the light extraction surface 25T, and subsequently thermosetting the resin.

In the light-emitting device 10, it is preferable that the outer edge of the top surface 25T of the wavelength conversion member 25 matches the edge of the opening portion 29OP. In this embodiment, the light extraction surface of the semiconductor light-emitting device 10 is defined by the opening portion 29OP of the top surface of the covering body 29 and the top surface 25T of the wavelength conversion member 25.

The covering body 29 embeds the light-emitting element 20, the p-side power feeding pad 23, and the bonding wire 24 on the mounting board 11. Accordingly, the covering body 29 can function as a sealing material of the semiconductor light-emitting device 10.

Figure 2:
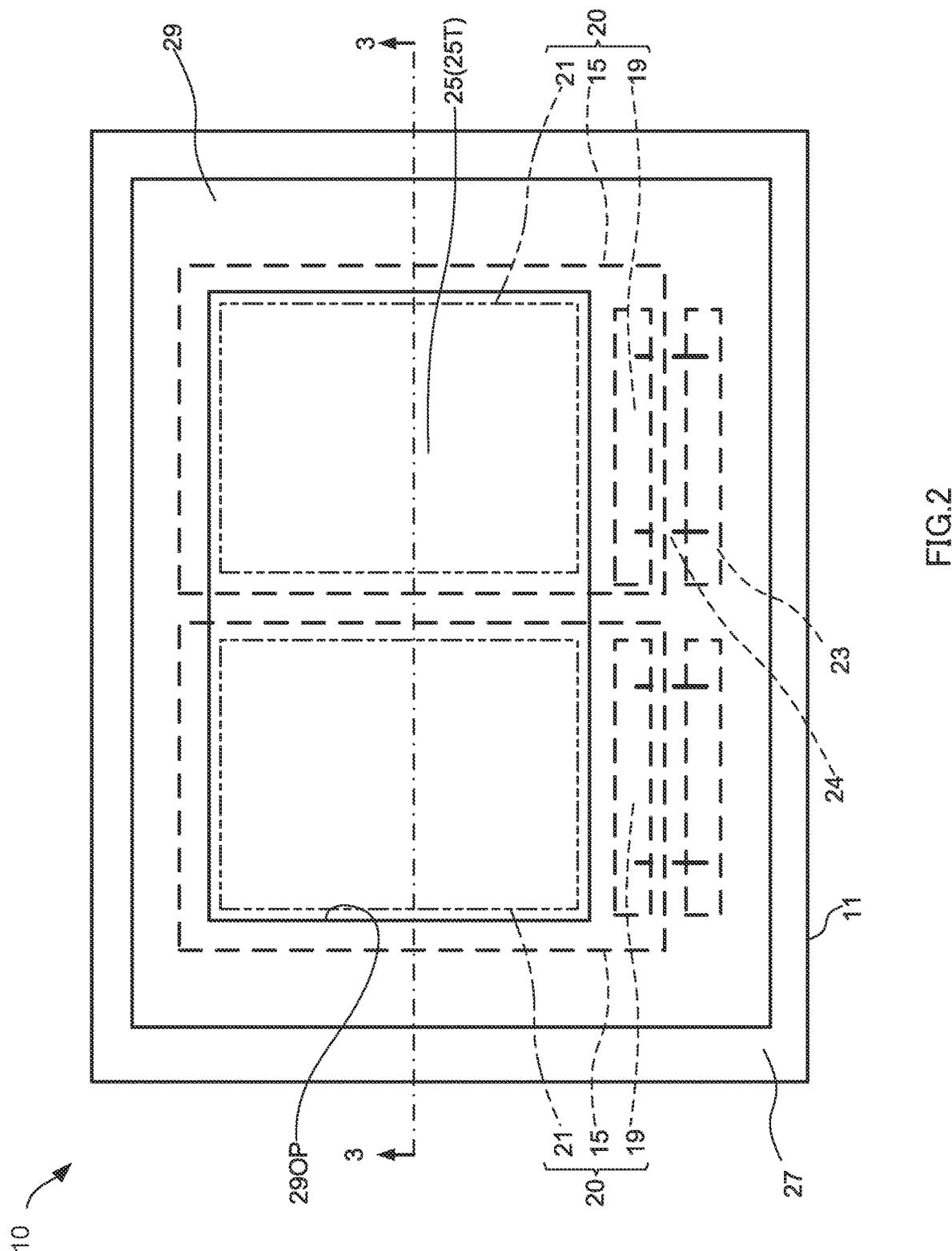
FIG. 2 is a top view of the light-emitting device according to Embodiment 1.

FIG. 2 is atop view of the semiconductor light-emitting device 10. As illustrated in FIG. 2, the mounting board 11 has a rectangular shape in top view. As described above, the rectangular frame-shaped peripheral wall body 27 is disposed on the mounting board 11. On the mounting surface 11S of the mounting board 11, the two light-emitting elements 20 including the rectangular supporting substrates 15 are mounted while being surrounded by the peripheral wall body 27 and arranged in the longitudinal direction of the mounting board 11.

As illustrated in FIG. 2, in this embodiment, the wavelength conversion member 25 is formed in a manner in which the contour of the wavelength conversion member 25, that is, the contour of the top surface 25T of the wavelength conversion member 25 has the sides each along the contour of the semiconductor stacked bodies 21 (indicated by two dot chain lines in the drawing) of the two light-emitting elements 20 in top view. In other words, the top surface 25T of the wavelength conversion member 25 is along the contours of the respective semiconductor stacked bodies 21 in top view. In further other words, the contour of the top surface 25T of the wavelength conversion member 25 is approximately the same as or slightly larger than the contour of the region in which the two semiconductor stacked bodies 21 are disposed. As described above, the top surface 25T of the wavelength conversion member 25 has the contour that matches the contour of the opening portion 29OP.

Figure 3:
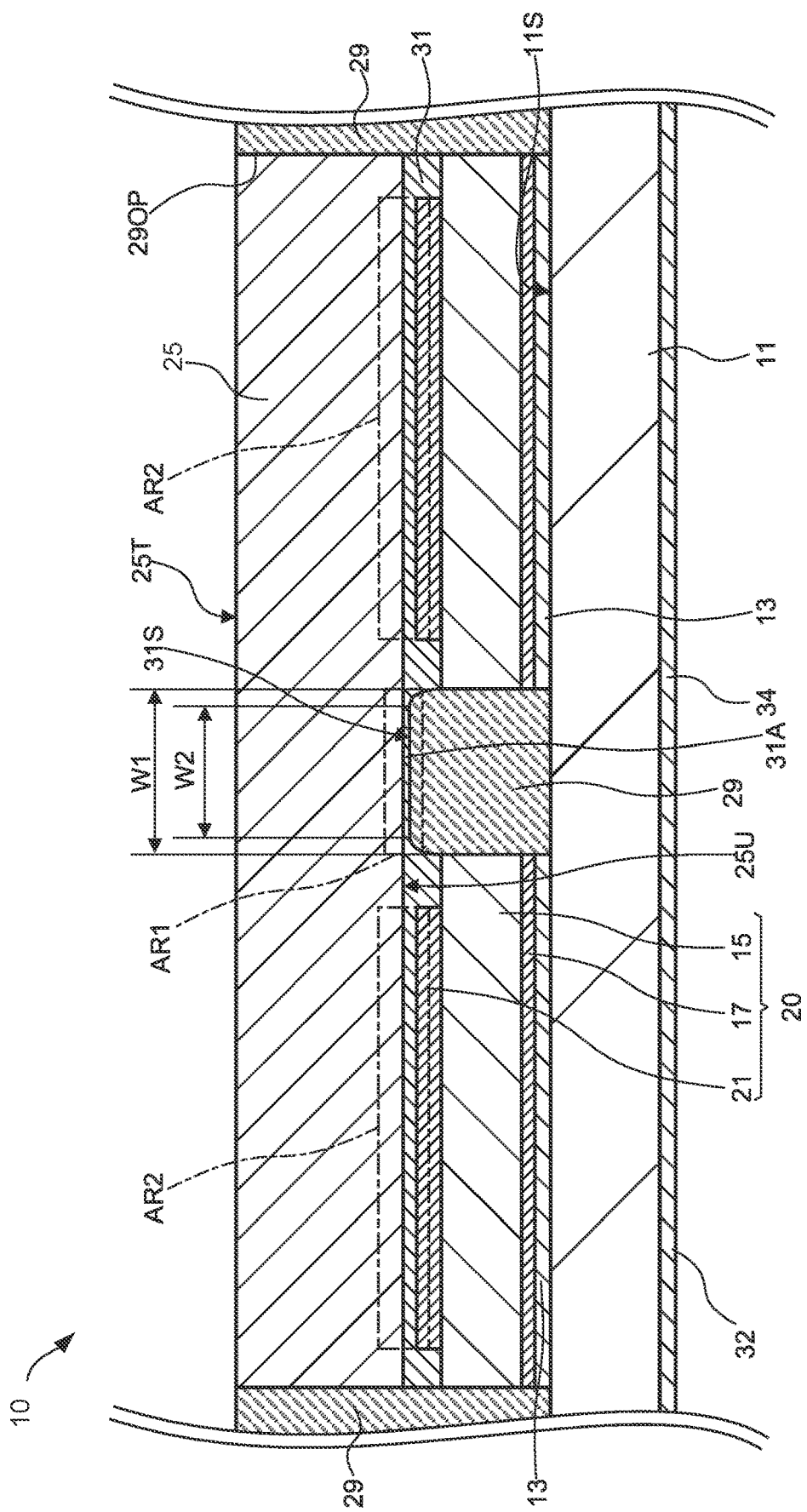
FIG. 3 is a cross-sectional view of the light-emitting device according to Embodiment 1.

FIG. 3 is a cross-sectional view of the semiconductor light-emitting device 10 of FIG. 2 taken along a line 3-3. As described above, the supporting substrate 15 is disposed on the mounting surface 11S of the mounting board 11 via the back surface electrode 17 and the n-side power feeding pad 13. As described above, the semiconductor stacked body 21 is bonded on the top surface of the supporting substrate 15 via the conductive bonding layer (not illustrated).

In this embodiment, a distance between the mutually adjacent light-emitting elements 20, that is, a distance between the supporting substrates 15 of the mutually adjacent light-emitting elements 20 is, for example, about 80 µm.

An adhesive layer 31 as a translucent member is formed to cover the top surface and the side surfaces of the semiconductor stacked body 21. That is, the adhesive layer 31 covers the semiconductor stacked body 21 on the supporting substrate 15. The adhesive layer 31 is formed by hardening a translucent adhesive material having transparency to the light emitted from the light-emitting element 20 with a method, such as thermosetting. The adhesive layer 31 is formed of a material having a small refractive index compared with the wavelength conversion member 25.

For example, the adhesive layer 31 is formed of a translucent resin, such as a silicone resin (refractive index $n_2 = 1.4$), having the small refractive index compared with the wavelength conversion member 25. The adhesive layer 31 covers a lower surface 25U of the wavelength conversion member 25. That is, the wavelength conversion member 25 is bonded on the top surface of the semiconductor stacked body 21 via the adhesive layer 31.

The adhesive layer 31 is formed to cover the entire lower surface 25U of the wavelength conversion member 25. That is, the adhesive layer 31 covers the lower surface 25U not only in regions opposing the respective light-emitting elements 20 but also a region AR1 (region surrounded by a one dot chain line in the drawing) facing a gap portion between the mutually adjacent light-emitting elements 20 in the lower surface 25U of the wavelength conversion member 25. The region AR1 can be also referred as a region between the plurality of light-emitting elements.

The region AR1 includes a thin film portion 31A as a thin film part in which the thickness of the adhesive layer 31 is approximately constant. That is, the adhesive layer 31 includes the thin film portion 31A having the approximately constant thickness, that is, the constant film thickness between the wavelength conversion member 25 and the covering body 29 in the region between the plurality of light-emitting elements. The thin film portion 31A having the constant thickness is formed in the center of a width W1 as the width of the region AR1 between the mutually facing end portions of the mutually adjacent light-emitting elements, in other words, the width W1 between the supporting substrates 15. The thin film portion 31A having the constant thickness has a width W2 preferably 50% or more of the width W1 of the region AR1, and further preferably 85% or more of the width W1 of the region AR1.

The thickness of the thin film portion 31A is preferably smaller than the thickness of the adhesive layer 31 in a region AR2 (region surrounded by a one dot chain line in the drawing) in which the semiconductor stacked body 21 is disposed in the region between the supporting substrate 15 and the wavelength conversion member 25, that is, smaller than a distance between the top surface of the semiconductor stacked body 21 and the lower surface of the wavelength conversion member 25. Specifically, the thickness of the thin film portion 31A is preferably ½ or less of the thickness of the adhesive layer 31 in the region AR2 in which the semiconductor stacked body 21 is disposed. That is, the thickness of the thin film portion 31A is preferably ½ or less of the distance between the top surface of the semiconductor stacked body 21 and the lower surface 25U of the wavelength conversion member 25.

In this embodiment, the thickness of the thin film portion 31A is 0.1 to 3 μm, and preferably 0.1 to 1.5 μm. For example, in this embodiment, the thickness of the adhesive layer in the region AR2 is 1 to 6 μm. Thus, the thickness of the thin film portion 31A is smaller than the distance between the top surface of the supporting substrate and the lower surface of the wavelength conversion member, or smaller than the thickness of the adhesive layer 31 in the region AR2, thereby allowing the reduction of light attenuation.

When the film thickness in the region of the thin film portion 31A is thick, the thin film portion 31A functions as an optical waveguide to the light-emitting element side, and multiple reflection occurs between the wavelength conversion member 25 and the covering body 29, thereby causing the light attenuation. For the thickness of the thin film portion 31A, an error approximately $\frac{1}{10}$ of the thickness of the adhesive layer 31 in the region AR2 is allowed.

The adhesive layer 31 can be formed by applying or potting a resin material having a thermosetting property as a precursor of the adhesive layer 31 over each of the light-emitting elements 20, placing the wavelength conversion member 25 thereon, and subsequently thermosetting the resin material. The resin material applied or potted over the light-emitting element 20 wets and spreads to cover the region AR1 in the lower surface 25U of the wavelength conversion member 25 when the wavelength conversion member 25 is placed. The thin film portion 31A covering the region AR1 is formed by this wet spreading.

Various kinds of particles can be mixed in the resin material as the precursor of the adhesive layer 31 for the purpose of improving heat dissipation and imparting thixotropy. Also in this case, it is preferable that the particle size is the particle diameter of 100 nm or less and the light scattering function is reduced. For example, to suppress dropping of the resin material on the supporting substrate side surface, a silica nano-filler in which the particle diameter is 1 nm or more and 10 nm or less can be added to adjust a viscosity.

An n-side lower surface electrode 32 is a metal electrode formed in a region opposing the region in which the n-side power feeding pad 13 is formed in the lower surface of the mounting board 11. The n-side power feeding pad 13 and the n-side lower surface electrode 32 are mutually electrically connected via the through-hole (not illustrated) penetrating the mounting board 11.

As illustrated in FIG. 3, the covering body 29 covers the entire side surface of the wavelength conversion member 25. That is, the top surface of the covering body 29 is formed from the upper end of the inner surface of the peripheral wall body 27 (see FIG. 1 and FIG. 2) up to the end portion of the light extraction surface 25T of the wavelength conversion member 25. The covering body 29 is filled to fill a gap between the mutually adjacent light-emitting elements 20.

As described above, the lower surface 25U of the wavelength conversion member 25 is covered with the adhesive layer 31 in the region AR1. Therefore, in the region between the mutually adjacent light-emitting elements 20, the covering body 29 is formed to cover the side surface of the supporting substrate 15 and the lower surface of the adhesive layer 31. In other words, the covering body 29 is formed not to contact the lower surface 25U of the wavelength conversion member 25.

As described above, the adhesive layer 31 is interposed between the lower surface 25U of the wavelength conversion member 25 and the covering body 29. Therefore, what is called a feedback light going downward from the lower surface 25U of the wavelength conversion member 25, specifically, a fluorescent light generated by an excitation light emitted from the light-emitting element 20 in the wavelength conversion member 25 and the excitation light reflected in the wavelength conversion member 25 reach an interface between the covering body 29 and the wavelength conversion member 25 in the region between the mutually adjacent light-emitting elements 20.

As described above, in the light-emitting device 10, since the adhesive layer 31 has the low light refractive index compared with the wavelength conversion member 25, at least a part of the feedback light is totally reflected by an interface between the adhesive layer 31 and the wavelength conversion member 25 and goes upward.

In other words, the total reflection occurs on the interface between the adhesive layer 31 and the wavelength conversion member 25, thereby reducing the feedback light that reaches the covering body 29 in the region between the mutually adjacent light-emitting elements 20. In contrast, when the adhesive layer 31 is not interposed and the light going downward from the wavelength conversion member 25 directly reaches the covering body 29, the feedback light is scattered or absorbed. Accordingly, by totally reflecting the feedback light on the interface between the adhesive layer 31 and the wavelength conversion member 25 and reducing the feedback light that reaches the covering body 29, the light emitted from the light extraction surface 25T of the light-emitting device 10 can be increased, thus enhancing the light extraction efficiency.

Since the absorption of the feedback light in the region between the mutually adjacent light-emitting elements 20 is reduced, the reduction of the emitted light from the region between the mutually adjacent light-emitting elements 20 can be decreased. Accordingly, a difference in intensity of the light emitted from the light extraction surface 25T between the region immediately above the light-emitting element 20 and the region between the mutually adjacent light-emitting elements 20 can be decreased, thus allowing enhancing uniformity of the intensity of the light emitted from the light extraction surface 25T.

In FIG. 3, between the mutually adjacent light-emitting elements 20, an interface 31S between the adhesive layer 31 and the covering body 29 is illustrated from the top surface outer edge of the supporting substrate 15 of one light-emitting element 20 to reach the top surface outer edge of the supporting substrate 15 of the other light-emitting element 20. That is, the interface 31S is illustrated so as to be formed from the outer edge of the supporting substrate 15. Since the interface 31S is formed to connect between the top surface outer edge of the supporting substrate 15 of the one light-emitting element 20 and the top surface outer edge of the supporting substrate 15 of the other light-emitting element 20, the shape stability of the interface 31S can be enhanced, thus allowing enhancing the shape stability of the thin film portion 31A.

However, the aspect of the interface 31S can be changed depending on the amount of the resin material as the precursor of the adhesive layer 31 applied over the light-emitting element 20 in bonding the light-emitting element 20 and the wavelength conversion member 25, the surface roughness of the lower surface 25U of the wavelength conversion member 25, or the like.

Figure 4:
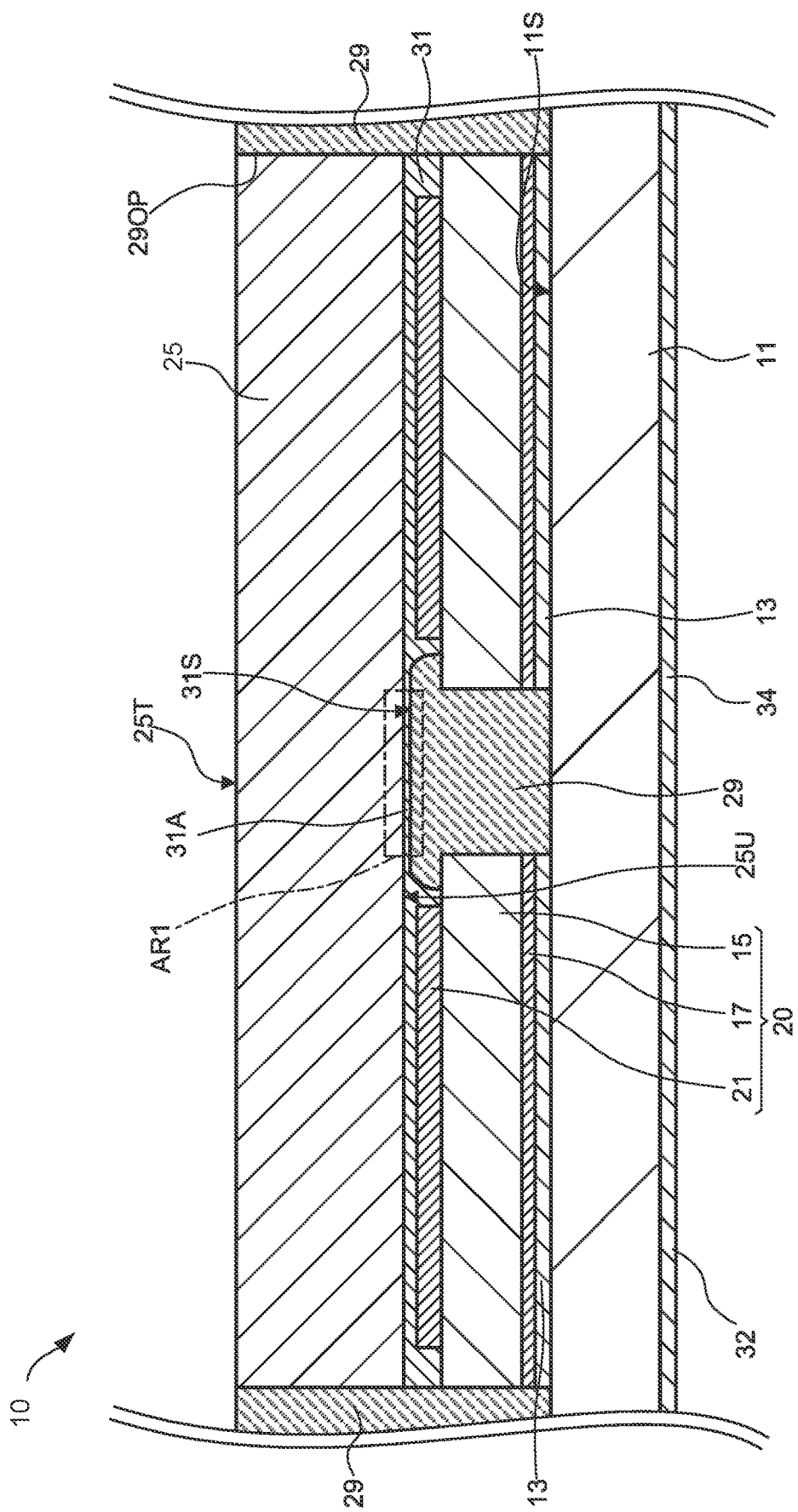
FIG. 4 is a cross-sectional view of a light-emitting device according to a modification.

For example, as illustrated in FIG. 4, the interface 31S may be formed from an inner portion with respect to the top surface outer edge of the supporting substrate 15. In other words, a part of the top surface of the supporting substrate 15 may be covered with the covering body 29. That is, the covering body 29 may extend from the top surface end portion facing the adjacent light-emitting element 20 of the supporting substrate 15 toward the semiconductor stacked body 21, and may cover a part of the top surface of the supporting substrate 15. In further other words, the thin film portion 31A may extend outside the above-described region AR1 between the plurality of light-emitting elements. That is, the width of the thin film portion 31A having the approximately constant film thickness can be larger than the width of the region AR1.

In the light-emitting device 10, the optical absorptance of the feedback light is often larger in the supporting substrate 15 than the covering body 29, for example, when the supporting substrate 15 is Si. Therefore, as illustrated in FIG. 4, the configuration in which the top surface of the supporting substrate 15 is covered with the covering body 29 allows enhancing the light extraction efficiency.

The interface 31S may be formed from the side surface of the supporting substrate 15. That is, the adhesive layer 31 may cover a part of the upper portion of the side surface of the supporting substrate 15. However, when the interface 31S is formed on the excessively lower portion of the side surface, the feedback light entering the adhesive layer 31 is multiply reflected between the interface 31S and the side surface of the supporting substrate 15, that is, between the covering body 29 and the side surface of the supporting substrate 15. Therefore, it is preferable that the adhesive layer 31 does not reach the side surface of the supporting substrate 15.

In the light-emitting device 10 of this embodiment, since the adhesive material of the adhesive layer 31 wets and spreads over the lower surface 25U of the wavelength conversion member 25, the above-described dropping of the adhesive material on the side surface of the supporting substrate 15 and the covering the side surface in bonding the wavelength conversion member 25 can be avoided, or the degree of the covering can be decreased. That is, in the light-emitting device 10, since the adhesive material of the adhesive layer 31 wets and spreads over the lower surface 25U of the wavelength conversion member 25, the extending of the adhesive layer 31 to the side surface of the supporting substrate 15 can be avoided.

Therefore, in the light-emitting device 10 of Embodiment 1, the extending of the adhesive layer 31 to drop on the side surface of the supporting substrate 15 can be avoided, or the degree of the extending of the adhesive layer 31 to drop on the side surface of the supporting substrate 15 can be decreased. Accordingly, the reduction of the light extraction efficiency and the reduction of the uniformity of the emission intensity in the light extraction surface 25T due to the multiple reflection of the feedback light between the covering body 29 and the side surface of the supporting substrate 15 can be avoided.

As described above, the aspect of the interface 31S can be changed depending on the amount of the resin material as the precursor of the adhesive layer 31 applied over the light-emitting element 20 or the surface roughness of the lower surface 25U of the wavelength conversion member 25. That is, the shape of the adhesive layer 31 in the region between the mutually adjacent light-emitting elements 20 can be changed depending on the surface roughness of the lower surface 25U of the wavelength conversion member 25.

For example, when the wavelength conversion member 25 is formed of phosphor ceramics fabricated by sintering alumina and YAG (yttrium-aluminum-garnet, $Y_3Al_5O_{12}$) phosphor at a high temperature as described above, even without processing (surface roughness Ra 0.237 μm), the shape of the adhesive layer 31 including the thin film portion 31A having the constant thickness as illustrated in FIG. 3 or FIG. 4 was obtained. That is, the interface 31S was formed from the outer edge of the supporting substrate 15 or the top surface of the supporting substrate 15.

For example, when the wavelength conversion member 25 is formed of the similar phosphor ceramics, also in the case where an wet etching was performed on the lower surface 25U (surface roughness Ra 0.147 μm) and in the case where a dicing was regularly performed (surface roughness Ra 0.500 μm), the shape of the adhesive layer 31 as illustrated in FIG. 3 or FIG. 4 was obtained. That is, the interface 31S was formed from the outer edge of the supporting substrate 15 or the top surface of the supporting substrate 15.

Assume that (actual surface area/mirrored surface area)× 100 is a surface area ratio (%) based on a mirrored surface area that is a surface area of the lower surface 25U when having the lower surface 25U of the wavelength conversion member 25 as a perfect mirror surface. The surface area ratio of the lower surface 25U of the wavelength conversion member 25 is preferably 105% or more and 150% or less, and further preferably 110% or more and 150% or less. The surface area ratio of the lower surface 25U of the wavelength conversion member 25 can be set to 105% or more and 150% or less by adjusting the manufacturing condition and the surface process condition, such as a wet etching condition and a dicing condition, of the wavelength conversion member 25.

To form the interface 31S from the outer edge of the supporting substrate 15 or the top surface of the supporting substrate 15, the surface area ratio of the lower surface 25U of the wavelength conversion member 25 is preferably 105% or more, and further preferably 110% or more. Since the excessively large surface area ratio increases the application amount of the adhesive material necessary for forming the adhesive layer 31, the surface area ratio is preferably 150% or less. In other words, in the light-emitting device 10, the actual ratio of the surface area of the lower surface 25U to the surface area when the lower surface 25U of the wavelength conversion member 25 is the mirrored surface, that is, the surface area ratio is preferably 150% or less.

Embodiment 2

The following describes a light-emitting device of Embodiment 2 in this application.

Figure 5:
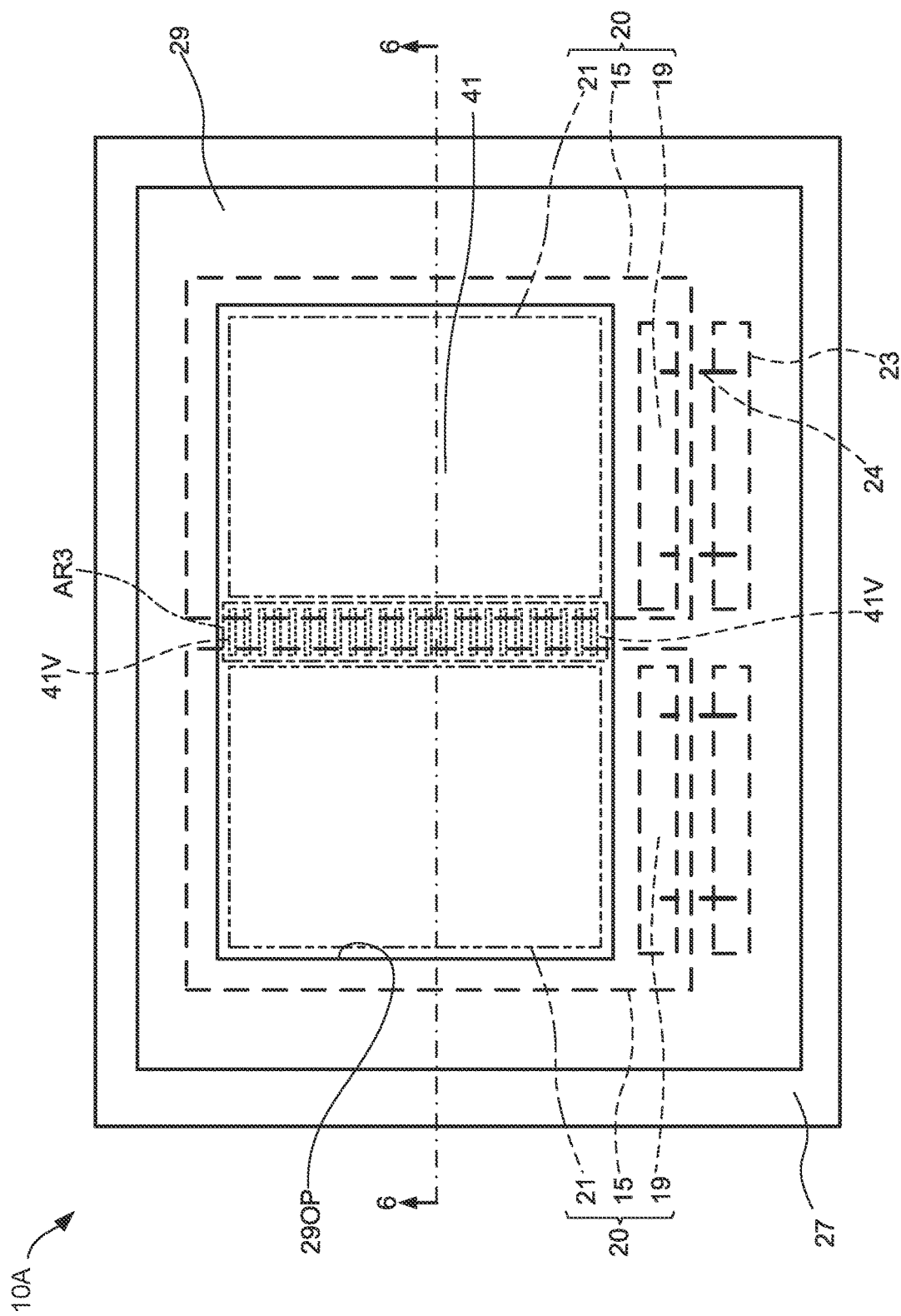
FIG. 5 is a top view of a light-emitting device according to Embodiment 2.

In FIG. 5, a light-emitting device 10A of Embodiment 2 in this application is different from the light-emitting device 10 of Embodiment 1 in that a portion having a different surface roughness is formed in the lower surface of the wavelength conversion member. Since the points other than the lower surface of the wavelength conversion member are similar to those in the light-emitting device 10 of Embodiment 1, the description will be omitted.

In the lower surface of a wavelength conversion member 41 of the light-emitting device 10A, a plurality of grooves 41V extending along the arranging direction of the light-emitting elements 20 are provided in a region between the mutually adjacent light-emitting elements 20, that is, a region AR3 (region surrounded by a one dot chain line) facing a gap portion between the mutually adjacent light-emitting elements 20. That is, the plurality of grooves 41V are grooves extending along a direction from one of the mutually adjacent light-emitting elements 20 toward the other. The region AR3 can be also referred to as a region between the plurality of light-emitting elements. For example, the plurality of grooves 41V are each formed to be parallel to a line connecting the centers of the two adjacent light-emitting elements. For example, the plurality of grooves 41V are each formed to be parallel to a side along the arranging direction of the two light-emitting elements 20 among the sides of the planar shape of the light-emitting element 20.

The plurality of grooves 41V are arranged in a direction perpendicular to the arranging direction of the light-emitting elements 20. The plurality of grooves 41V can be formed by a cutting work with a dicing blade, laser processing, or the like. The groove 41V is a strip-shaped groove, for example, having a depth of several μm. Also in the light-emitting device 10A, the thin film portion 31A in which the thickness of the adhesive layer 31 is approximately constant is formed in the region AR3. The thin film portion 31A having the constant thickness is formed in the center of a width W3 of the region AR3.

The thin film portion 31A having the constant thickness has a width W4 preferably 50% or more of the width W3 of the region AR3, and further preferably 85% or more of the width W3.

The thickness of the thin film portion 31A is preferably ½ or less of the thickness of the adhesive layer 31 in a region AR4 in which the semiconductor stacked body 21 is disposed in the region between the supporting substrate 15 and the wavelength conversion member 41. That is, the thickness of the thin film portion 31A is preferably ½ or less of a distance between the top surface of the semiconductor stacked body 21 and a lower surface 41U of the wavelength conversion member 41.

In this embodiment, the thickness of the thin film portion 31A is 0.1 to 3 μm, and preferably 0.1 to 1.5 μm. For example, in this embodiment, the thickness of the adhesive layer 31 between the top surface of the semiconductor stacked body 21 and the lower surface 41U of the wavelength conversion member 41 is 1 to 6 μm. Thus, the thickness of the thin film portion 31A is smaller than the distance between the top surface of the supporting substrate and the lower surface of the wavelength conversion member, or smaller than the thickness of the adhesive layer 31 in the region AR4, thereby allowing the reduction of light attenuation.

When the film thickness in the region of the thin film portion 31A is thick, the thin film portion 31A functions as an optical waveguide to the light-emitting element side, and multiple reflection occurs between the wavelength conversion member 41 and the covering body 29, thereby causing the light attenuation. For the thickness of the thin film portion 31A, an error approximately ¹⁄₁₀ of the thickness of the adhesive layer 31 in the region AR4 is allowed.

Figure 6:
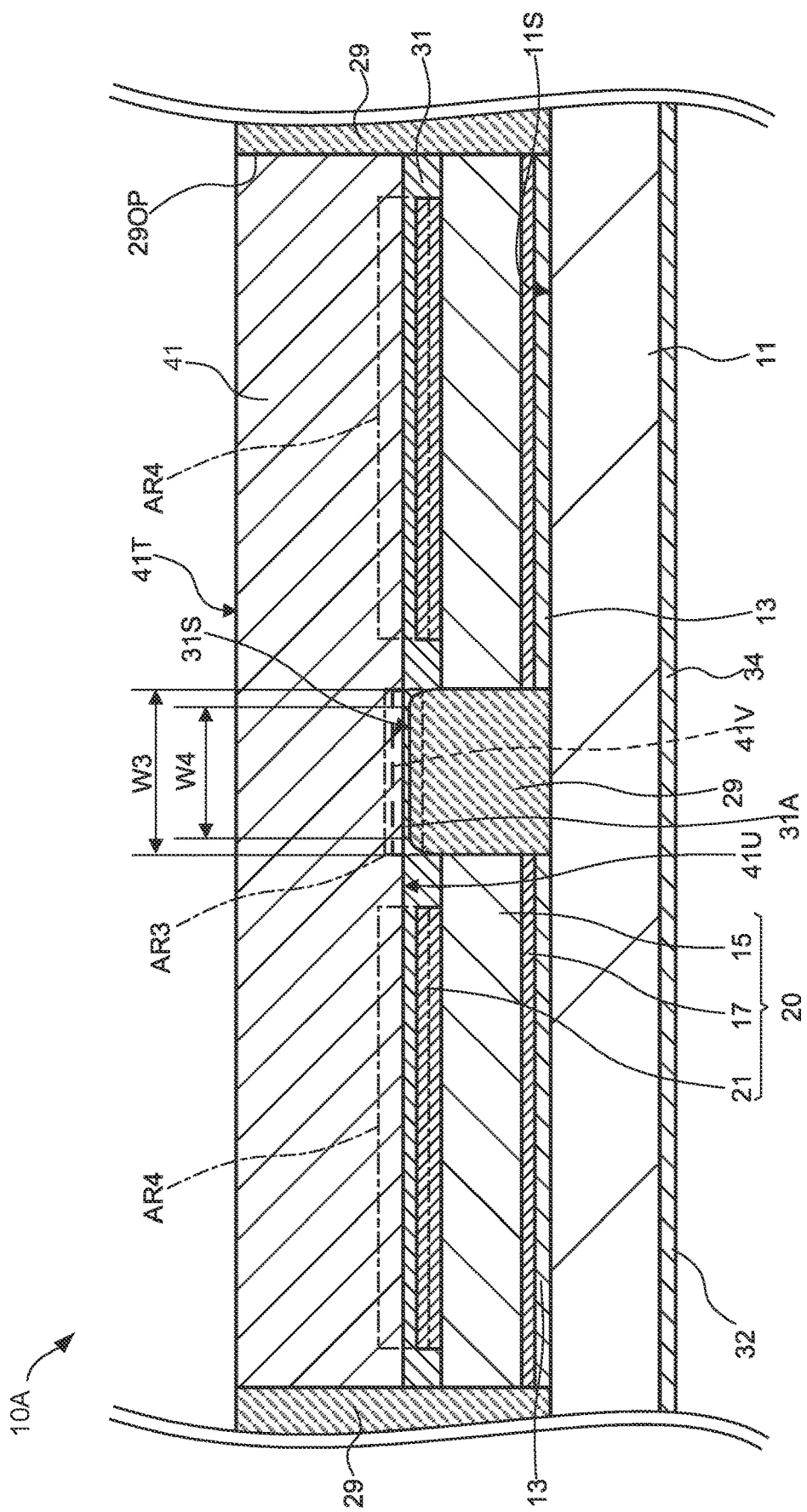
FIG. 6 is a cross-sectional view of the light-emitting device according to Embodiment 2.

FIG. 6 illustrates a cross-sectional view taken along a line 6-6 in FIG. 5. As illustrated in FIG. 5, the plurality of grooves 41V are formed in the region AR3 between the mutually adjacent light-emitting elements 20, that is, a region corresponding to the thin film portion 31A in which the adhesive layer 31 has the constant thickness in the lower surface 41U of the wavelength conversion member 41. In other words, the plurality of grooves 41V are formed in a region opposing the region between the two adjacent light-emitting elements in the lower surface of the wavelength conversion member 41.

Thus, in the light-emitting device 10A of Embodiment 2, the plurality of grooves 41V are formed in the region AR3 between the mutually adjacent light-emitting elements 20 in the lower surface 41U of the wavelength conversion member 41.

Accordingly, when the wavelength conversion member 41 is placed on the light-emitting element 20 and the wavelength conversion member 41 is bonded on the light-emitting element 20, the adhesive material as the precursor of the adhesive layer 31 easily wets and spreads in the region AR3 in the lower surface 41U of the wavelength conversion member 41.

The easiness in wet spreading is because, for example, forming the groove 41V in the region AR3 increase the surface roughness in the region AR3 compared with the other portion, thus increasing the wettability. In other words, in the region opposing the region between the two adjacent light-emitting elements in the lower surface of the wavelength conversion member 41, the surface roughness is larger than that in the other region, and the wettability is increased. The easiness in wet spreading is because, for example, a capillarity by the groove 41V occurs, thereby spreading the adhesive material along the groove 41V. Thus, forming the groove 41V in the region AR3 allows, for example, facilitating the formation of the thin film portion 31A with more certainty.

Since the adhesive material easily wets and spreads in the region AR3, the adhesive material applied or potted over the light-emitting element 20 easily moves from the region near the region AR3 in the top surface of the supporting substrate 15 to the region AR3 in the lower surface 41U. This facilitates the formation of the structure as illustrated in FIG. 4 described in the description of Embodiment 1, that is, the structure in which the top surface of the supporting substrate 15 near the region AR2 is covered with the covering body 29.

Since the adhesive material easily wets and spreads in the region AR3, the adhesive material applied or potted over the light-emitting element 20 easily moves from the region near the region AR3 in the top surface of the supporting substrate 15 to the region AR3 in the lower surface 41U. Accordingly, the adhesive material applied or potted over the top surface of the supporting substrate 15 can be avoided spreading to drop on the side surface of the supporting substrate 15.

That is, in the light-emitting device 10A of Embodiment 2, since the adhesive material further wets and spreads in the region AR3 in the lower surface 41U of the wavelength conversion member 41 compared with the other region, the above-described possibility that the adhesive material drops on the side surface of the supporting substrate 15 and covers the side surface in bonding the wavelength conversion member 25 can be reduced.

That is, in the light-emitting device 10A, since the adhesive material wets and spreads in the region AR3 in the lower surface 41U of the wavelength conversion member 41 compared with the other region, the adhesive layer 31 can be avoided extending so as to drop to the side surface of the supporting substrate 15.

Therefore, similarly to the light-emitting device 10, since the light-emitting device 10A of Embodiment 2 employs the structure in which the adhesive layer 31 covers the lower surface 41U of the wavelength conversion member 41 in the region AR3, the amount of the feedback light that reaches the covering body 29 can be reduced, and the reduction of the light extraction efficiency and the reduction of the uniformity of the emission intensity in the light extraction surface 25T can be avoided.

Therefore, similarly to the light-emitting device 10, in the light-emitting device 10A of Embodiment 2, the extending of the adhesive layer 31 to drop on the side surface of the supporting substrate 15 can be avoided, or the degree of the extending of the adhesive layer 31 to drop on the side surface of the supporting substrate 15 can be decreased. Accordingly, the reduction of the light extraction efficiency and the reduction of the uniformity of the emission intensity in the light extraction surface 25T due to the multiple reflection of the feedback light between the covering body 29 and the supporting substrate 15 can be avoided. The formation of the groove 41V in the lower surface 41U of the wavelength conversion member 41 ensures the formation of the thin film portion 31A in a stable size with certainty.

The groove 41V in the lower surface 41U of the wavelength conversion member 41 is formed at least in the center of the width W3 of the region AR3. The groove 41V in the lower surface 41U of the wavelength conversion member 41 is preferably formed to have a length 50% or more of the width W3. The groove 41V in the lower surface 41U of the wavelength conversion member 41 may be formed to have the length equal to or more than the width W3.

In the above description of Embodiment 2, while the groove 41V in the lower surface 41U of the wavelength conversion member 41 is preferably formed in one direction along the arranging direction of the light-emitting elements, a groove formed in a direction intersecting with the direction may be included.

In the above description of Embodiment 2, while the case where the groove 41V is formed in the region AR3 is described, it is only necessary that the adhesive material as the precursor of the adhesive layer 31 easily wets and spreads in the region AR3 compared with the other portion. Therefore, for example, it is only necessary that the surface roughness is increased in the region AR3 compared with the other region in the lower surface 411U of the wavelength conversion member 41.

As the processing to increase the surface roughness, an etching, such as a wet etching, may be performed other than the cutting work with a dicing blade and the process with a laser described above. For example, processing for decreasing the wettability in the region other than the region AR3 in the lower surface 41U may be performed. For example, a polishing of the region other than the region AR3 in the lower surface 41U may be performed to decrease the surface roughness. For example, a coating of the region other than the region AR3 in the lower surface 41U may be performed to decrease the wettability or the surface roughness.

In the region AR1 and the region AR3, the adhesive layer 31 needs not completely cover the entire surfaces of the lower surfaces 25U, 411U of the wavelength conversion members 25, 41. For example, in the region AR1 and the region AR3, the lower surfaces 25U, 41U of the wavelength conversion members 25, 41 may be partially exposed from the adhesive layer 31. Also in this case, in the portions in which the adhesive layer 31 covers the lower surfaces 25U, 41U, the total reflection occurs on the interfaces between the adhesive layer 31 and the wavelength conversion members 25, 41, and the light extraction efficiency and the uniformity of the emission intensity in the light extraction surface can be improved.

In the above-described Embodiments, while the case where the wavelength conversion members 25 and 41 are formed of ceramic plates is described, the wavelength conversion members 25 and 41 may be formed of other materials. For example, the wavelength conversion members 25 and 41 may be formed of a glass support body having a surface on which a thin film containing phosphor is formed. The wavelength conversion member 25 and 41 may include a glass substrate formed by dispersing phosphor particles of a few microns to a dozen microns therein. In this case, the lower surfaces 25U and 41U of the wavelength conversion members 25 and 41 may be processed so as to have the surface roughness similar to that of the above-described ceramic plate.

In the above-described Embodiments, while the case where the two light-emitting elements 20 are arranged in a row on the mounting board 11 in the light-emitting devices 10, 10A is described as an example, the three or more light-emitting elements 20 may be arranged in a row.

For example, the four light-emitting elements 20 may be arranged in a row on the mounting board 11. The light-emitting elements 20 may be arranged in two or more rows on the mounting board 11. In this case, the regions similar to the regions AR1, AR3 can be formed in regions opposing the regions between the adjacent light-emitting elements in the lower surfaces 25U, 41U described above. Accordingly, the total reflection on the interfaces between the wavelength conversion members 25, 41 and the adhesive layer 31 occurs in the regions, thereby allowing enhancing the light extraction efficiency and the uniformity of the emission intensity in the light extraction surface.

The configurations in the above-described embodiments are merely examples, and can be appropriately changed depending on the usage and the like.

DESCRIPTION OF REFERENCE SIGNS 10, 10A Light-emitting device
11 Mounting board
11S Mounting surface
13 n-side power feeding pad
15 Supporting substrate
17 Back surface electrode
19 Power feeding electrode
Light-emitting element 21 Semiconductor stacked body
23 p-side power feeding pad
25 Wavelength conversion member
25T Light extraction surface
27 Peripheral wall body
29 Covering body
31 Adhesive layer
31A Thin film portion
AR1 Region
AR2 Region
AR3 Region

What is claimed is:

1. A light-emitting device comprising:
a mounting board;
a plurality of light-emitting elements that each include a supporting substrate and a semiconductor structure layer, the supporting substrate being disposed on the mounting board, and the semiconductor structure layer being formed on the supporting substrate and including a light-emitting layer;
a wavelength conversion member that covers the plurality of light-emitting elements above the light-emitting elements and converts a wavelength of a light emitted from the light-emitting layer;
a translucent member that covers a lower surface of the wavelength conversion member and covers the semiconductor structure layer on the supporting substrate; and
a resin member filled between the plurality of light-emitting elements, the resin member being formed of a resin material containing particles having a light reflectivity,
wherein:
the translucent member includes a thin film portion having a constant film thickness between the wavelength conversion member and the resin member in a region between the plurality of light-emitting elements, and the constant film thickness is smaller than a distance between a top surface of the supporting substrate and a lower surface of the wavelength conversion member.

2. The light-emitting device according to claim 1, wherein the thin film portion has a thickness smaller than a distance between a top surface of the light-emitting element and the lower surface of the wavelength conversion member.

3. The light-emitting device according to claim 1, wherein the resin member extends toward the semiconductor structure layer from an end portion of one light-emitting element and covers a part of the top surface of the supporting substrate in the top surface of the supporting substrate, and the end portion faces an adjacent light-emitting element.

4. The light-emitting device according to claim 1, wherein in one region opposing the region between the plurality of light-emitting elements in the lower surface of the wavelength conversion member, a surface roughness is large compared with another region.

5. The light-emitting device according to claim 1, wherein a plurality of grooves are formed in a region opposing a region between two adjacent light-emitting elements in the lower surface of the wavelength conversion member.

6. The light-emitting device according to claim 5, wherein the plurality of grooves are formed to be parallel to a line connecting centers of the two adjacent light-emitting elements.

7. The light-emitting device according to claim 1, wherein:
in the lower surface of the wavelength conversion member, a surface area ratio is in a range of 105% or more and 150% or less, assuming that the surface area ratio is 100% when the lower surface of the wavelength conversion member is a perfect mirrored surface, and
the surface area ratio is a ratio of an actual surface area of the lower surface to a mirrored surface area of the lower surface expressed as a percentage.

* * * * *